United States Patent [19]

Tateoka et al.

[11] Patent Number: 5,059,550
[45] Date of Patent: Oct. 22, 1991

[54] METHOD OF FORMING AN ELEMENT ISOLATING PORTION IN A SEMICONDUCTOR DEVICE

[75] Inventors: Hidehisa Tateoka, Tenri; Shigeo Onishi, Nara; Kenichi Tanaka, Nara, all of Japan

[73] Assignee: Sharp Kabushiki Kaisha, Osaka, Japan

[21] Appl. No.: 425,924

[22] Filed: Oct. 24, 1989

[30] Foreign Application Priority Data

Oct. 25, 1988 [JP] Japan .................................. 63-268999
Jan. 13, 1989 [JP] Japan ...................................... 1-6413

[51] Int. Cl.$^5$ .......................................... H01L 21/76
[52] U.S. Cl. ..................................... 437/67; 437/238; 437/63
[58] Field of Search .......................... 437/67, 238, 241

[56] References Cited

U.S. PATENT DOCUMENTS

| | | | |
|---|---|---|---|
| 4,239,811 | 12/1980 | Kemlage | 437/238 |
| 4,700,464 | 10/1987 | Okada et al. | 437/67 |
| 4,746,625 | 5/1988 | Morita et al. | 437/63 |
| 4,845,054 | 7/1989 | Mitchener | 437/238 |

FOREIGN PATENT DOCUMENTS 59-149030  8/1984  Japan ..................................... 437/67

OTHER PUBLICATIONS

Wolf et al., Silicon Processing for the VLSI ERA, vol. 1, Lattice Press, Sunset Beach, CA (1986), p. 194.
P. C. Hunt et al., "Process HE: A Highly Advanced Trench Isolated Bipolar Technology for Analogue and Digital Applications", IEEE 1988 Custom Integrated Circuits Conference, pp. 22.2.1–22.2.4.

*Primary Examiner*—Olik Chaudhuri
*Assistant Examiner*—M. Wilczewski
*Attorney, Agent, or Firm*—Sandler, Greenblum & Bernstein

[57] ABSTRACT

A method for manufacturing a semiconductor device comprising:
  making a trench in a Si semiconductor substrate;
  forming on the surface of the substrate a thermal oxidation film a $Si_3N_4$ film, and a $SiO_2$ film by a chemical vapor deposition as a three-layered insulating film, in that order;
  forming a polysilicon layer to fill the trench;
  removing the polysilicon layer outside the trench; and
  performing one of the following steps: (A) converting the exposed surface of the polysilicon layer in the trench to a $SiO_2$ film, and removing the insulating film on the Si semiconductor substrate outside the trench; (B) removing the $SiO_2$ layer of the insulating film, converting the exposed surface of the polysilicon layer in the trench to a $SiO_2$ film, removing the $Si_3N_4$ layer of the insulating film located above the opening of the trench, depositing a $SiO_2$ film, and forming a side wall by leaving this $SiO_2$ film only at the peripheral portion of the $SiO_2$ film; whereby an element isolating portion is formed in the trench.

11 Claims, 21 Drawing Sheets

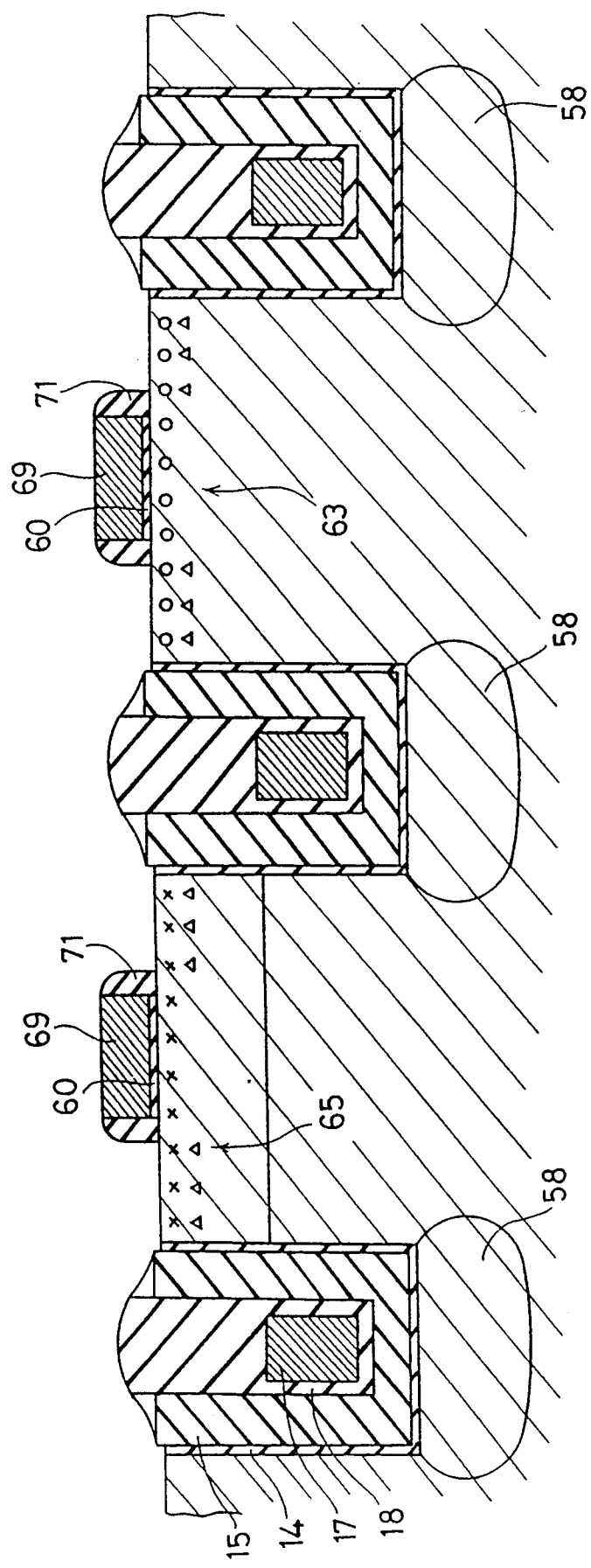

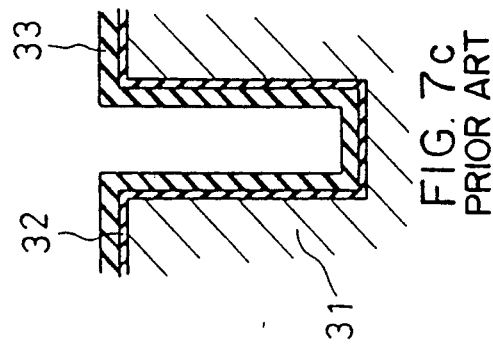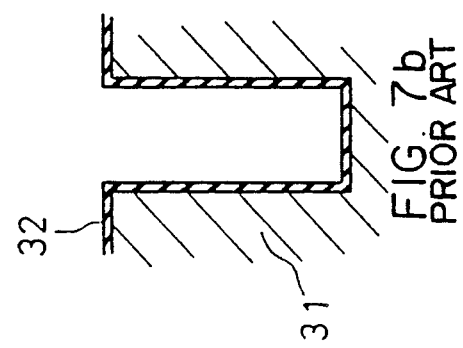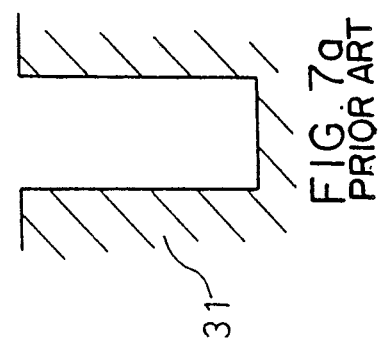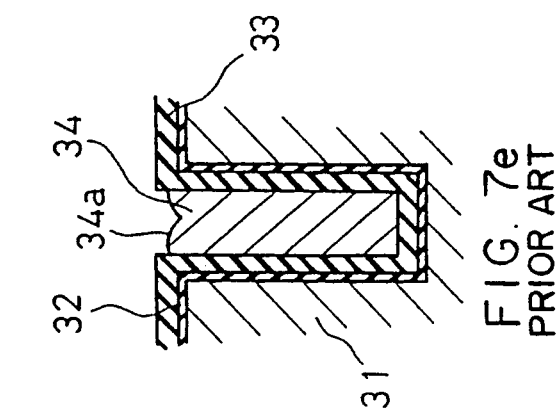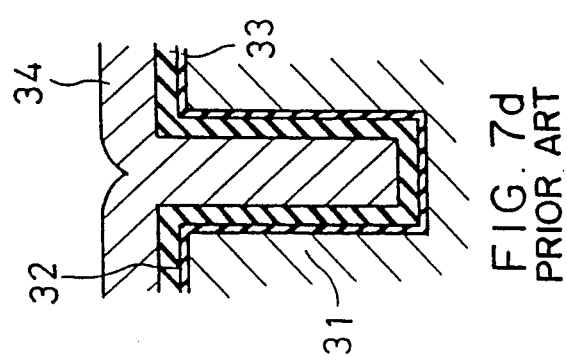

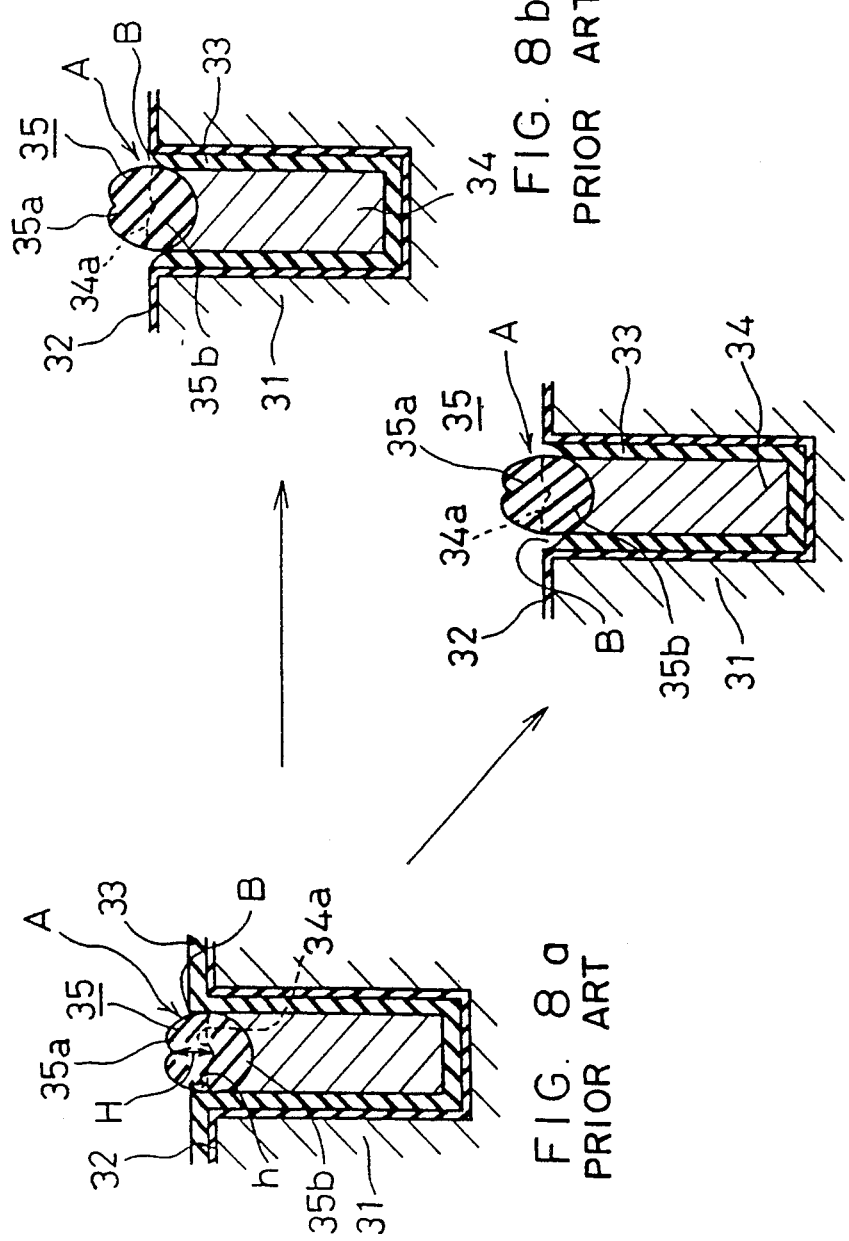

METHOD OF FORMING AN ELEMENT ISOLATING PORTION IN A SEMICONDUCTOR DEVICE

BACKGROUND OF THE INVENTION

1. Field of the Invention

The present invention relates to a method of manufacturing a semiconductor device and, more specifically, it relates to a method of forming an element isolating portion by forming a deep groove; namely a trench, in a silicon semiconductor substrate;, covering the trench with an insulating film; filling the trench with polysilicon to make a polysilicon layer and, oxidizing the exposed surface of the polysilicon layer with heat. The method according to the present invention is useful for the formation of an element isolation or information storing capacitor needed for high integration of a MOS device or bipolar device.

2. Description of the Prior Art

In recent years, as MOS or bipolar devices have been miniaturized and improved in function, serious efforts have been made to develop a method of isolating elements with a trench by a technique of trenching on a Si substrate. Usually, in isolating elements in the device, a trench having a high aspect ratio of a depth of 6 μm to a width of 1 μm must be formed. However, it is difficult to completely fill such a trench with polysilicon (referred to as poly-Si below) by an ordinary vapor deposition. Conventionally, deposition of poly-Si is performed by Low Pressure Chemical Vapor Deposition (referred to as LPCVD below); namely, step coverage is well performed.

A typical process for manufacturing a conventional trench isolated element by such a deposition technique will be described with reference to FIG. 7.

First, a trench having a width of about 1 μm is formed in a Si semiconductor substrate 31 by etching (FIG. 7(a)). Then, a thermal oxidization film 32 (FIG. (7(b)) of about 100–300 Å and an $Si_3N_4$ film 33 (FIG. (7(c)) of about 2000–3000 Å are formed on the surface of the Si semiconductor substrate 31. The $Si_3N_4$ film 33 is for preventing the Si semiconductor substrate 31 from being oxidized laterally from the trench and, usually, has a thickness as stated above to have enough pressure resistance between the Si substrate and a poly-Si layer mentioned below. Then, a poly-Si layer 34 is deposited by LPCVD (FIG. 7 (d)), and then it is etched back by anisotropic dry etching. Thus, the trench is filled with poly-Si 34 (FIG. 7(e)) An exposed surface 34a of the poly-Si layer 34 is oxidized with heat to convert an outer surface of the poly-Si into an oxidation film 35, and thereafter the $Si_3N_4$ film 33 in the region except for the trench or the $Si_3N_4$ film 33 in the same region and the thermal oxidation film 32 therebelow are removed. In this way, the trench isolated element is available.

According to the above mentioned method of manufacturing a trench isolated element, the oxidation film 35 formed on the surface of the poly-Si layer 34 in the trench (see FIG. 8) consists of a portion 35a growing upward from the original surface (exposed surface) 34a of the poly-Si layer 34 and another portion 35b defined as a result of diffusion into the poly-Si layer 34 from the original surface 34a.

In the above conventional manufacturing method, however, the thickness of the vertically growing oxide film 35 has a significant difference in the central portion of the exposed surface 34a of the poly-Si layer and in the peripheral portion thereof. In many cases, for example, the ratio of the film thickness in the central portion (the thickness of the oxide film 35 from the central portion of the exposed surface 34a to the upper central surface of the oxide film 35) H to the film thickness in the peripheral portion (the thickness from an end of the exposed surface 34a to the upper end surface of the oxide film 35) h is approximately 7 : 1. As a result, there exist a large difference A in level and a narrow gap B between the oxide film 35 in the trench and the $Si_3N_4$ film 33 around the trench, as shown in FIG. 8(a). Reference numeral 35 designates the oxide film of $SiO_2$ and numeral 34a indicating a broken line designates the exposed surface of the poly-Si layer 34 before the oxide film is formed.

Even when the substrate as shown in FIG. 8(a) is etched by Reactive Ion Etching (RIE) to remove the $Si_3N_4$ film 33 on the surface of the substrate except for the part of that film in the trench, the aforementioned large difference A can not be reduced and the narrow gap B can not be removed (see FIG. 8 (b)). On the other hand, when the substrate is treated with phosphoric acid or the like by wet etching to remove the $Si_3N_4$ film, the level difference and the gap become larger because of the isotropic etching (see FIG. 8(c)).

In an isolated element having a difference in level and a narrow gap around the trench, when gate electrodes are formed by etching in making a plurality of FET devices by using this isolated element, the elements are finished with irregularities, namely, a portion which should have been completely etched away is left. This often causes electrical troubles such as a short-circuit between gate electrodes, which should be prevented in view of the reliability required of the devices. Accordingly, it has been desired to develop a method of manufacturing a trench isolated element in which the difference in level and the narrow gap in the marginal portion of the trench, as stated above, do not exist.

Further, Japanese Published Unexamined Patent Application No. 1045/1988 discloses another method by which an information storing capacitor can be easily formed in which underlying $SiO_2$ film and $Si_3N_4$ film serve as dielectric by connecting a poly-Si film to a capacitor plate.

As shown in FIG. 9, according to this method, a trench 21a is formed in a Si substrate 21, and then a $SiO_2$ film 22 and a $Si_3N_4$ film 23 are successively formed (FIG. 9(a)). After that, the trench 21a is filled with poly-Si film. The entire surface of the poly-Si film 24 is etched by an isotropic RIE so that only the poly-Si film 24 in the trench 21a remains (FIG. 9(b)). Then, a $SiO_2$ film 25 is formed on the surface of the poly-Si film 24 by thermal oxidation. The $SiO_2$ film formed near the trench on the substrate 21 is removed. After that, the $Si_3N_4$ film 23 in all regions except for the trench is removed by wet etching with a phosphoric acid liquid or by wet etching (FIG. 9(c)).

In the conventional method shown in FIG. 9, the trench has a width of 1.2 μm or below, the $Si_3N_4$ film has a thickness of 1000–2000 Å (100–200 Å if a capacitor is formed), and the poly-Si film has a thickness (the height of the poly-Si film deposited on the surface of the Si substrate except for the trench, above the surface of the Si substrate) almost the same as the width of the trench.

For example, assume that the width of the trench is 1 μm, the thickness of the $Si_3N_4$ film is 100 Å and the thickness of the poly-Si film is 1 μm. If the poly-Si film of 1 μm is overreached by about 10% when it is etched back with a selection ratio poly-Si/$Si_3N_4$ of about 4 to 5, even the $Si_3N_4$ film 23 in the region except for the trench may be etched away. The Si substrate loses its mask against oxidation, so that an oxide film grows in a field area to be the surface of the trench 21a.

As shown in FIG. 10, under the condition where the trench width is 1 μm, the Si film thickness is 2000 Å and the poly-Si film thickness is 6000 Å, when ultimately the $Si_3N_4$ film 23 is removed, there exists a difference A in level (a level difference of 2000 Å in the $Si_3N_4$ film) between a part 25a of the oxide film and a part 23a of the $Si_3N_4$ film (FIG. 10(a)). When the oxide film 25 in the field area is removed by HF, a recession 29 may be locally made in the film 25 as shown in FIG. 10(b). These level differences A and local recessions 29 cause disconnection and the like.

Accordingly, the present invention provides a method of manufacturing a semiconductor device by which a level difference, narrow gap and recession as stated above are avoided in the manufacturing process.

SUMMARY OF THE INVENTION

It is an object of the present invention to provide a method for manufacturing a semiconductor device comprising the steps of making a trench in a Si semiconductor substrate, forming on the surface, including the trench of the Si semiconductor substrate, a thermal oxidation film, a $Si_3N_4$ film, and a $SiO_2$ film by CVD as a three-layered insulating film in that order, forming a poly-Si layer to fill the trench having the three-layered insulating film with poly-Si, removing the poly-Si layer outside the trench, and performing one of the following (A) or (B) : (A) converting the exposed surface of the poly-Si layer in the trench to a $SiO_2$ film by thermal oxidation, and removing the three-layered insulating film on the Si semiconductor substrate outside the trench, or (By) removing the $SiO_2$ film of the three-layered insulating film located above the exposed surface of the poly-Si layer in the trench, converting the exposed surface of the poly-Si layer in the trench to a $SiO_2$ film by thermal oxidation, removing the $Si_3N_4$ film of the three-layered insulating film located above the opening of the trench, depositing a $SiO_2$ film by a chemical vapor deposition on the entire surface of the Si semiconductor substrate including the trench, and forming a side wall by leaving this $SiO_2$ film only at the peripheral portion of the $SiO_2$ film formed by the thermal oxidation; whereby an element isolating portion is formed in the trench.

BRIEF DESCRIPTION OF THE DRAWINGS

FIG. 7 is a view presented for explaining manufacturing steps in a prior art embodiment;

FIG. 8 is a view presented for explaining disadvantages in the prior art embodiment;

DETAILED DESCRIPTION OF THE PREFERRED EMBODIMENT

Figure 1A:
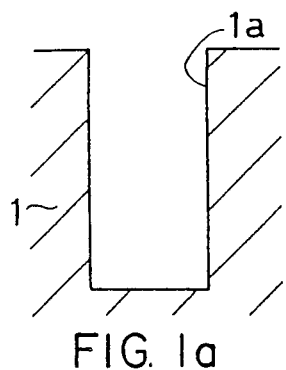
FIG. 1 is a view showing sequential manufacturing steps for forming an element isolating portion based upon the principle of a first embodiment of the manufacturing method according to the present invention.
Figure 1B:
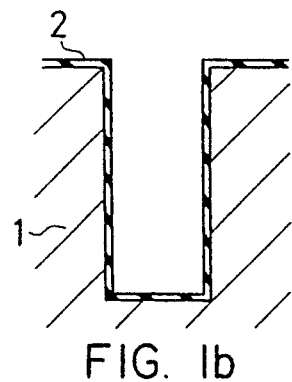
Figure 1C:
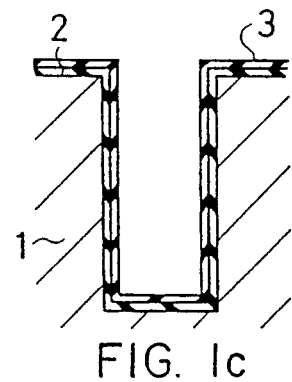
Figure 1D:
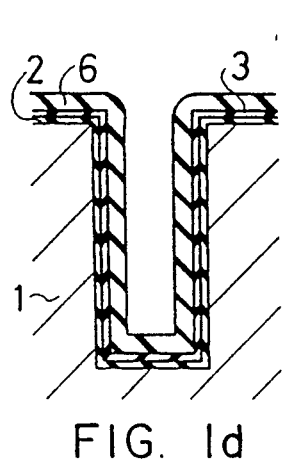

The method of manufacturing a semiconductor according to the present invention is characterized in that a three-layered insulating film is used when a trench formed in a Si semiconductor substrate is filled with poly-Si, and in that the three-layered insulating film comprises a superficial insulating film and a $SiO_2$ film formed on the surface thereof by chemical vapor deposition (CVD) and the superficial insulating film further consists of an underlying thermal oxidation $SiO_2$ film and a $Si_3N_4$ film.

Some techniques used for implementing the present invention are known; namely, methods of forming the $SiO_2$ film on the $Si_3N_4$ film, depositing poly-Si to fill the trench with its film, removing the poly-Si layer, oxidizing the exposed surface of the poly-Si layer buried in the trench with heat, removing the three-layered insulating film on the surface of the Si semiconductor substrate, forming a side wall, etc.

The method according to the present invention may be used to solve the problem of the level difference and the narrow gap at the marginal portion of the trench, the problem of the $SiO_2$ film that grows in the field area of the trench, and the problem of the recession in the $SiO_2$ film made when the $SiO_2$ film in the field area is removed with HF.

The poly-Si layer in the trench is directly surrounded by the $SiO_2$ film, which is the uppermost layer of the three-layered insulating film on the Si semiconductor substrate and is formed by CVD. Therefore, the $SiO_2$ film grows efficiently during thermal oxidation of the exposed surface of poly-Si layer, because oxygen is supplied and transported well not only to the central portion but also to the peripheral portion of the poly-Si layer in view of the presence of the underlying $SiO_2$ film compared with the conventional manner, so that the level difference and the narrow gap at the marginal portion of the trench are nearly or completely eliminated.

In the case where the $Si_3N_4$ film is thick, lastly removing three-layered insulating film outside the trench even if the level difference is made between the top portion of the Si semiconductor substrate and the $SiO_2$ film formed by a thermal oxidation of the exposed surface of the poly-Si layer in the trench, the level difference may be reduced by forming the side wall of $SiO_2$ around the $SiO_2$ film by CVD.

Further, the selection ratio of the $SiO_2$ film is larger than that of the $Si_3N_4$ film in removing the poly-Si layer, since the poly-Si layer is formed in the trench after the $SiO_2$ film is formed on the $Si_3N_4$ film by CVD. Therefore, the $SiO_2$ film reduces the amount of the $Si_3N_4$ film to be removed when the poly-Si layer is removed, so that a larger portion of the $Si_3N_4$ film remains.

Furthermore, since the side wall which surrounds the SiO$_2$ film formed by the thermal oxidation of the exposed surface of the poly-Si layer in the trench is made of the SiO$_2$ film by CVD in order to reduce the level difference, formation of the recession is inhibited at the HF cleaning step.

Accordingly, the present invention advantageously provides a method by which etching can be carried out perfectly, or by which a portion to be etched is removed perfectly when gate electrodes are formed in the production of a plurality of FET elements, so that electrical trouble such as a short-circuit between the gate electrodes can be inhibited and the reliability of the elements can be enhanced.

The thermal oxidation film of SiO$_2$ in the three-layered insulating film can be formed by the known wet-or dry-oxidation method. An appropriate thickness of the thermal oxidation film is between 100 and 300Å. The Si$_3$N$_4$ film can be formed by the known CVD. An appropriate thickness of the film is between 300 and 700 Å, which is thinner than that of the conventional film.

The SiO$_2$ film which is used for forming the SiO$_2$ film on the Si$_3$N$_4$ film and the side wall is formed by CVD. This CVD may be one of the several kinds of known CVD methods. However, this CVD preferably is a method by which step coverage is well performed, particularly, a method by which CVD is carried out at a temperature of 700 to 900° C. with a mixed gas of SiH$_4$ and N$_2$O, or a method by which CVD is carried out at a temperature of 350 to 450° C. with a mixed gas of tetra ethoxy-silane and ozone. The film formed by the former method is usually called HTO (High-Temperature Oxide) film, and that formed by the latter method is usually called a TEOS (Tetra Ethoxy-Silane) film. An appropriate thickness of the SiO$_2$ film is between 500 and 3000 Å, when the film is used as one of the films in the three-layered insulating film.

Usually, the thickness of the SiO$_2$ film which is used for forming the side wall is preferably about the height F of a portion of the SiO$_2$ film 18 exposed through the opening 15a of the trench 15 (see FIG. 5(f)); the SiO$_2$ film 18 is formed by oxidizing with heat the exposed surface of the poly-Si layer 17 in the trench (see FIGS. 5(c) and 5(d)). Thus, the thickness is usually about 3000 Å. Various known methods of etching a SiO$_2$ film are applied to the formation of the side wall.

CVD, particularly LPCVD, is suitable as a method for filling the trench with the poly-Si. The portion of the poly-Si layer disposed outside of the trench is removed by etching the poly-Si layer after the deposition of the poly-Si layer, since the poly-Si layer should be only in the trench. The etching is preferably an isotropic etching.

The heat oxidation of the exposed surface of the buried poly-Si layer may be by a known thermal oxidation method, which is performed through a wet thermal oxidation under 950 to 1100° C. This wet thermal oxidation is carried out until the central portion of the oxide film to be formed becomes 8000–12000 Å in thickness, although the period of time required for the wet thermal oxidation is indefinite.

After forming the above oxide film, the portion of the three-layered insulating film on the surface of the substrate outside of the trench is removed. Various known methods of etching SiO$_2$ and Si$_3$N$_4$ are applied to this removal operation.

FIG. 1 is a view showing sequential manufacturing steps for forming an element isolating portion based upon the principle of a first embodiment of the manufacturing method according to the present invention. The method of manufacturing a C-MOS transistor in accordance with this principle is a first embodiment. The C-MOS transistor will be described with reference to FIG. 4.

In FIG. 1, a trench 1a which isolates elements with a width of about 1 μm and a depth of about 6 μm is made by RIE method on a Si semiconductor substrate 1 (see FIG. 1(a)). After that, a thermal oxide film 2 of SiO$_2$ having a thickness of about 300 Å is, formed on the surface of the substrate 1 under a dry oxidation condition at 950° C. (see FIG. 1(b)). Then, a Si$_3$N$_4$ film 3 having a thickness of about 500 Å is formed by CVD with SiH$_4$ and NH3 (see FIG. 1(c)). Further, a SiO$_2$ film 6, or HTO film, having a thickness of about 2000 Å is formed by CVD with SiH$_4$ and N$_2$O at 800° C. Accordingly, a three-layered insulating film is obtained (see FIG. 1(d)).

Figure 1E:
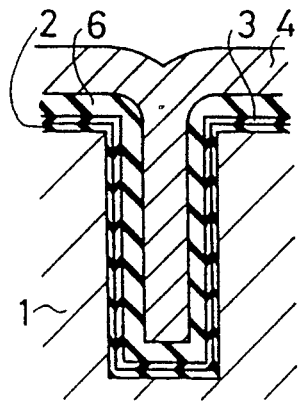
Figure 1F:
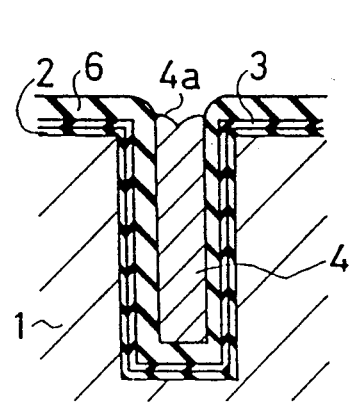
Figure 1G:
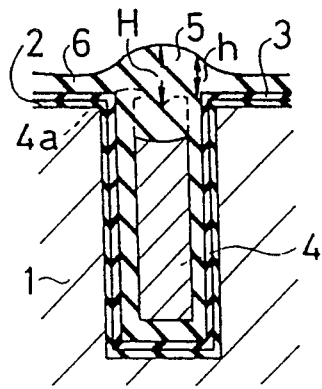

After that, a poly-Si layer 4 is deposited on the entire surface of the substrate by LPCVD (see FIG. 1(e)). The layer 4 is etched by an isotropic etching through RIE method, so that a substrate having the poly-Si layer 4 only in the trench can be obtained (see FIG. 1(f)).

The resultant substrate is oxidized with the exposed surface 4a of the poly-Si layer 4 under a wet oxidation condition at 1050° C. As a result, a SiO$_2$ film 5 is formed, which rises from the original exposed surface and diffuses into the poly-Si layer therefrom (see FIG. 1(g)). Based on observations with SEM, the SiO$_2$ film 5 has a thickness H of about 9000 Å at the central portion of the trench and a thickness h of about 3000 Å at the peripheral portion of the trench, that is, the thickness H of the central portion : the thickness h of the peripheral portion)=3 : 1. This means that the difference in thickness between the central portion and the peripheral portion is very small compared with that in a conventional embodiment, and the surface becomes flat because there is neither a difference in level nor a gap at the marginal portion of the trench as shown in FIG. 8.

Figure 1H:
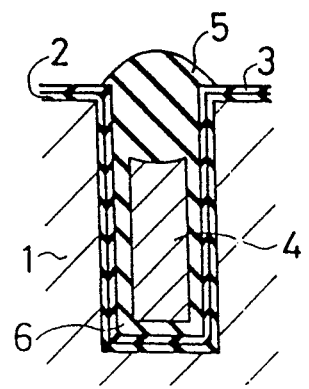

After that, a part of the SiO$_2$ film 6, namely, the uppermost layer of the three-layered insulating film, outside of the trench is removed by an isotropic etching with hydrogen fluoride (see FIG. 1(h)). Then, the Si$_3$N$_4$ film 3 and the thermal oxidation film 2 are removed by RIE so that a trench insulating element is obtained (see FIG. 1(i)).

An n+ diffusion layer and a p+ diffusion layer were formed in a trench isolating element with an isolating portion intervening therebetween, and junction leakage currents in reverse direction were measured. As a result, the junction leakage current at the end of the trench was lower than 1012 A/mm at room temperature. This value is almost the same as that of an isolating element having an oxidation film made by an ordinary LOCOS method.

Figure 2A:
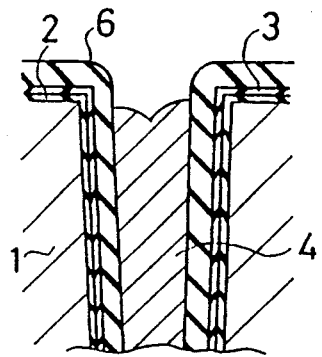
FIG. 2 is a view presented for explaining the state of a $SiO_2$ film when it is etched back in the above steps.
Figure 2B:
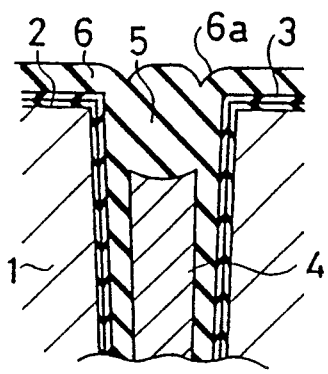
Figure 2C:
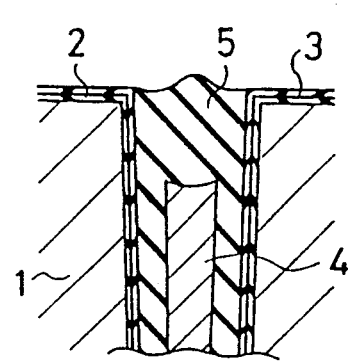

When the poly-Si layer 4 is etched back, the quality of the poly-Si layer and the irregularities thereon due to etching influence the etching back significantly so that the poly-Si layer may sometimes be excessively etched (overetched) as shown in FIG. 2(a). If the poly-Si layer 4 is considerably overetched, a small groove 6a may be caused during thermal oxidation as shown in FIG. 2(b). However, such a groove 6a may be considerably or completely removed by etching the three-layered insulating film away by an isotropic etching (see FIG. 2(c)), and there is accordingly no problem caused by this groove.

Figure 3A:
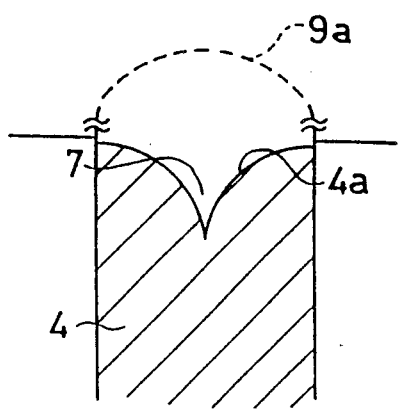
FIG. 3 is a view presented for explaining the superficial configuration of the $SiO_2$ film in the above steps.
Figure 3B:
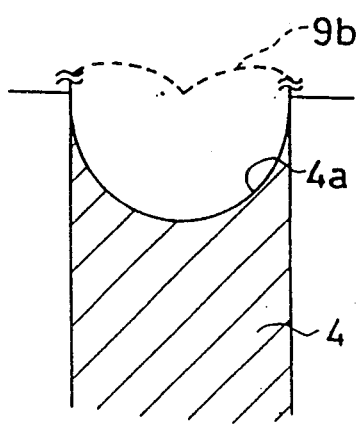

In the above embodiment, a relatively sharp recession 7 is made in the surface 4a of the poly-Si layer 4 as shown in FIG. 3(a) because the poly-Si is etched back by an anisotropic etching. As a result, when an oxide film 6 grows, the surface 9a of the oxide film becomes convex in the center portion or the peripheral portion of the trench as shown in a broken line in FIG. 3(a). On the other hand, when the poly-Si layer 4 is etched back by an isotropic etching through the RIE method, the surface 4a makes a gentle concavity as shown in FIG. 3(b), and when the poly-Si layer 4 is oxidized with heat, the surface 9b of the resultant $SiO_2$ film becomes almost flat. Thus, the etching back is preferably performed by an isotropic etching.

A method of manufacturing a C-MOS transistor in accordance with the principle explained in conjunction with FIG. 1 will now be described with reference to FIG. 4.

Figure 4A:
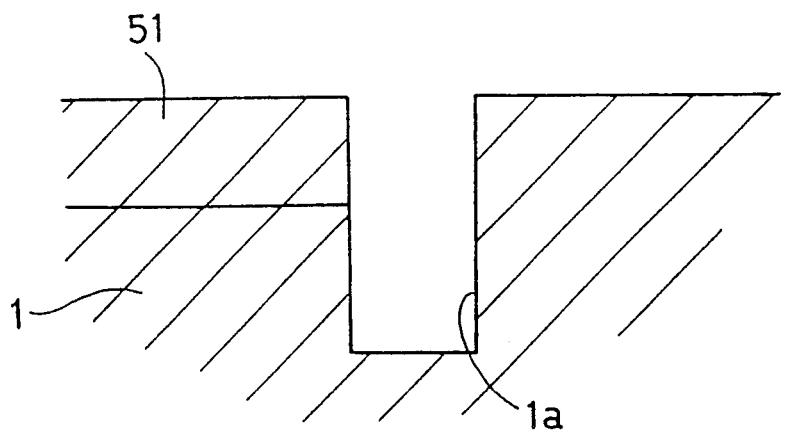
FIG. 4 is a view presented for explaining the manufacturing steps of the embodiment according to the present invention.

First, as shown in FIG. 4(a), an n- well layer 51 is formed on a Si semiconductor substrate 1 having a trench 1a. The n- well layer 51 is formed by a process including the steps of treating the Si semiconductor substrate 1 by the well-known photolithography technique, implanting n- impurities into it and diffusing the n- impurities in it.

Figure 1I:
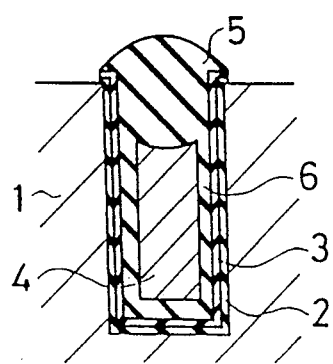
Figure 4B:
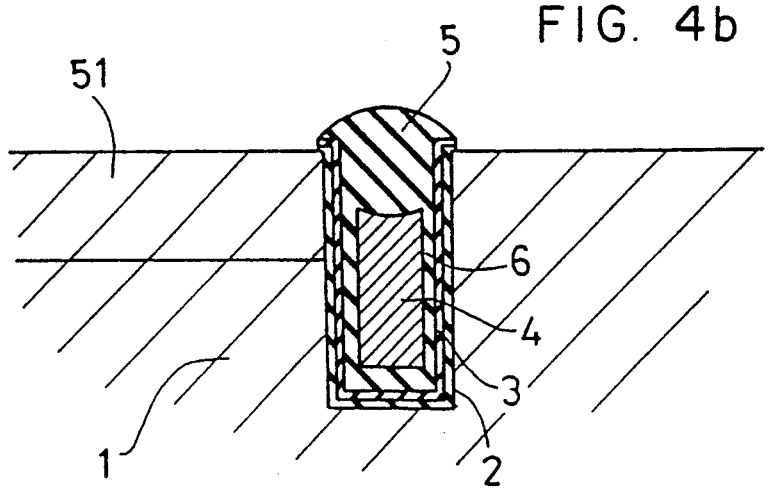
Figure 4C:
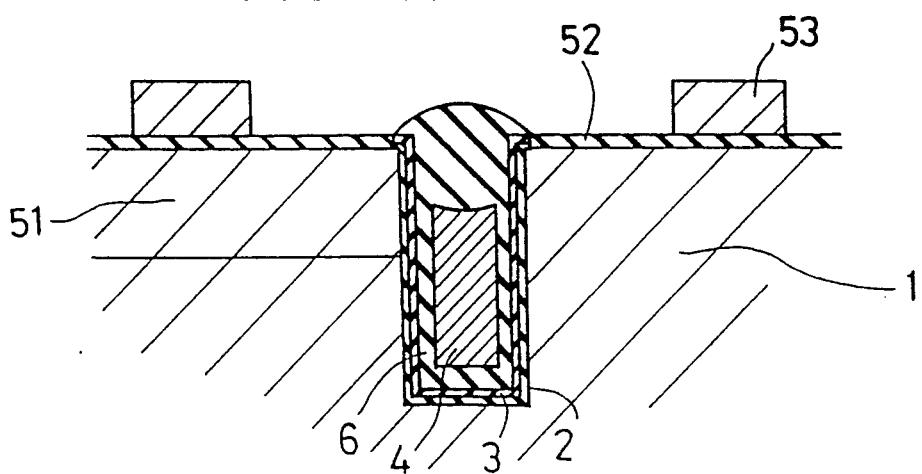

Then, a trench isolated portion is formed through the steps shown in FIG. 1(b) to FIG. 1(h) as shown in FIG. 4(b) (see FIG. 1(i)).

After that, the Si semiconductor substrate 1 is oxidized with heat to form a gate oxide film 52. Further, a gate electrode 53 is formed (see FIG. 4(c)) by making a gate layer on the gate oxide film 52 and treating the gate by the well-known photolithography.

Figure 4D:
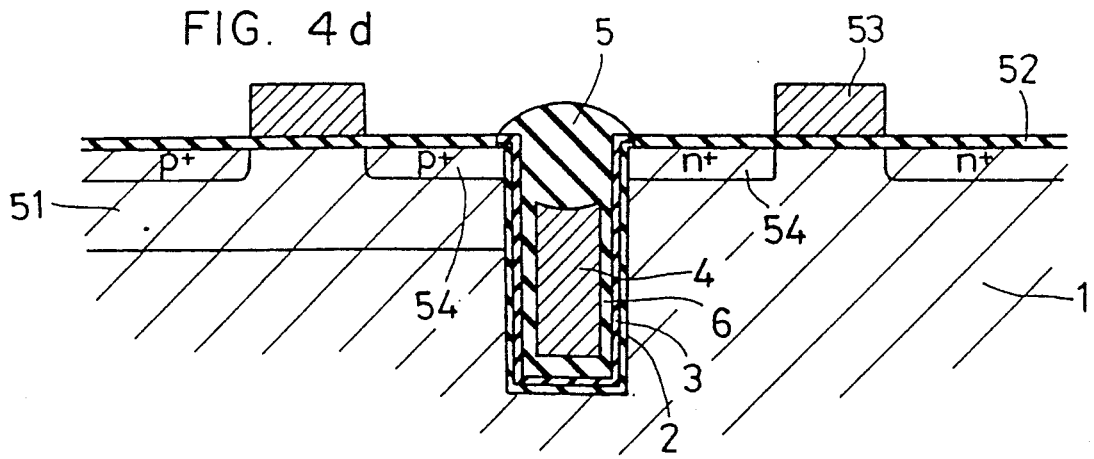
Figure 4E:
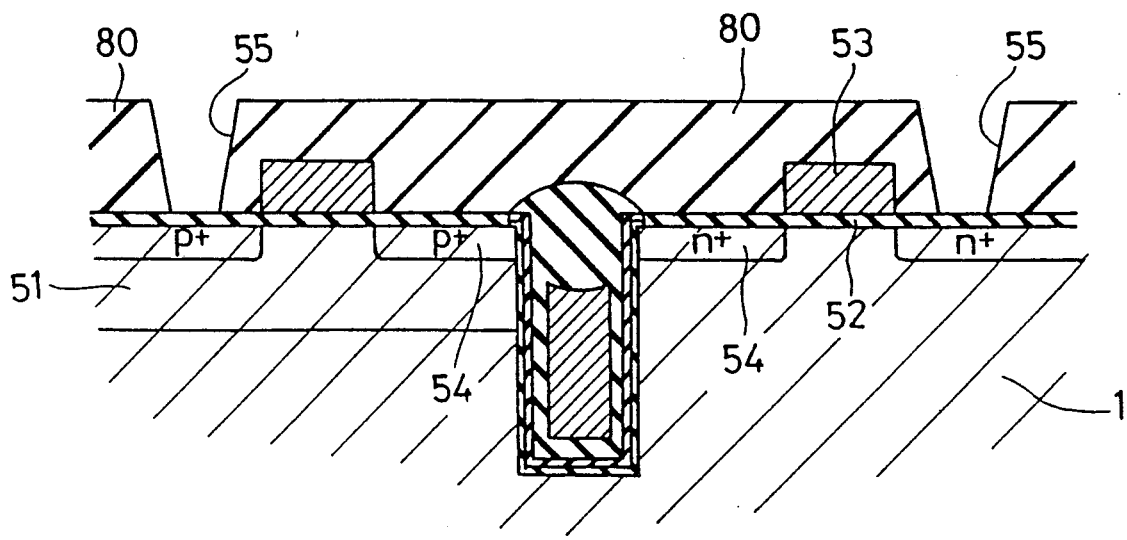

Then, a source-drain portion 54 is formed (see FIG. 4(d)) and thereafter a contact portion (55) is formed (see FIG. 4(e)). The contact portion 55 is formed by making a BPSG film 80 over the entire surface of the Si semiconductor substrate 1 and treating the BPSG film by photolithography.

Figure 4F:
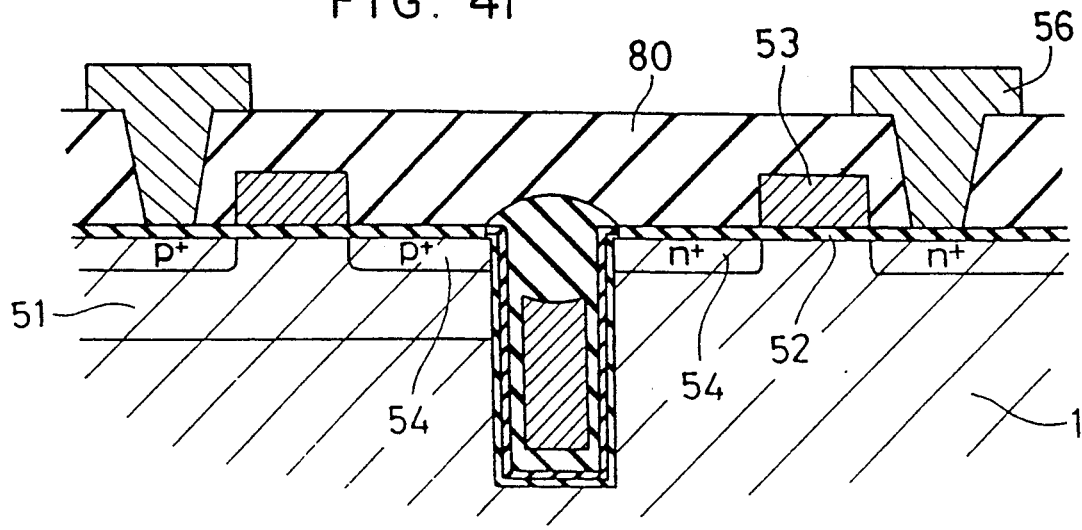

Lastly, a wiring portion 56 of Al-Si is formed in the contact portion 55 (see FIG. 4(f)). The wiring portion 56, similar to the above, is formed by the well-known wiring method.

Figure 5:
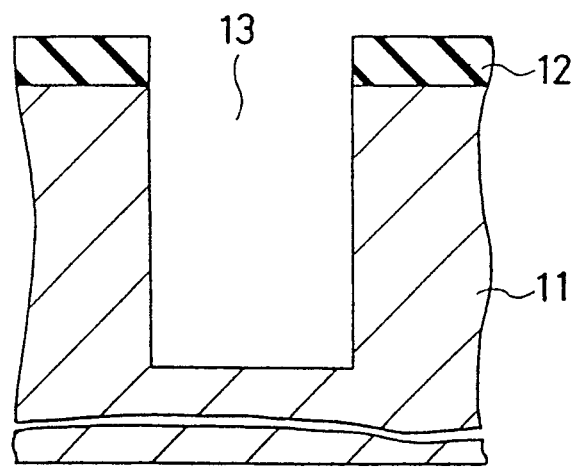
FIG. 5 is a view showing sequential manufacturing steps for forming an element isolating portion based upon the principle of a second embodiment of the manufacturing method according to the present invention.
Figure 5:
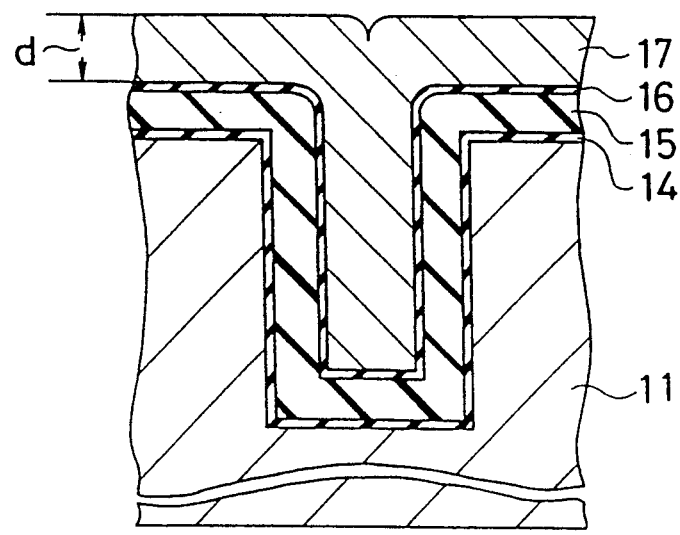
Figure 5:
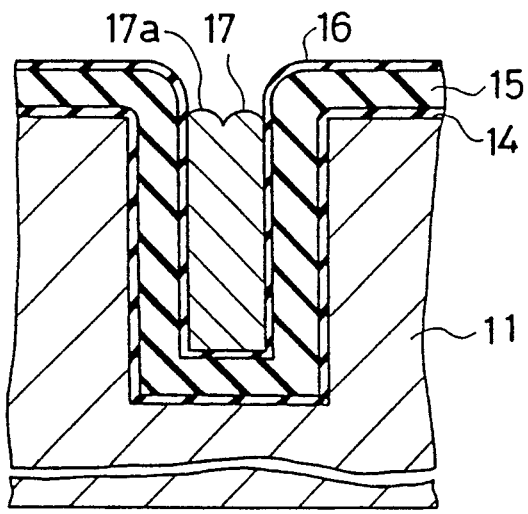
Figure 5:
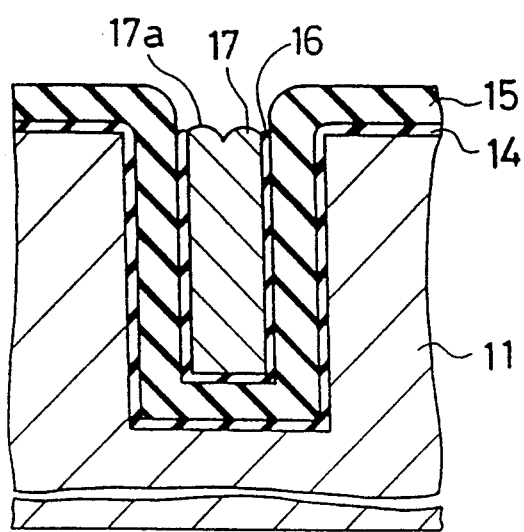
Figure 5:
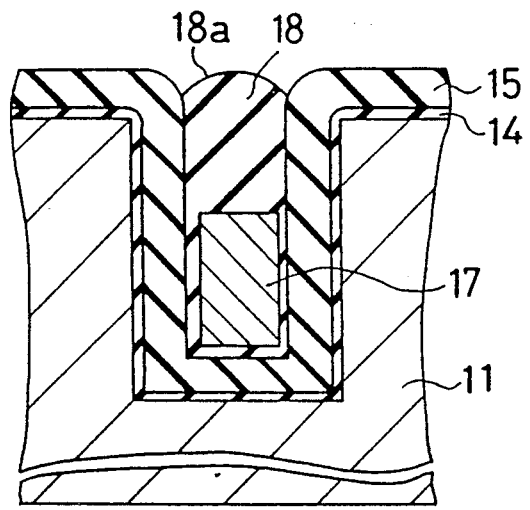
Figure 5:
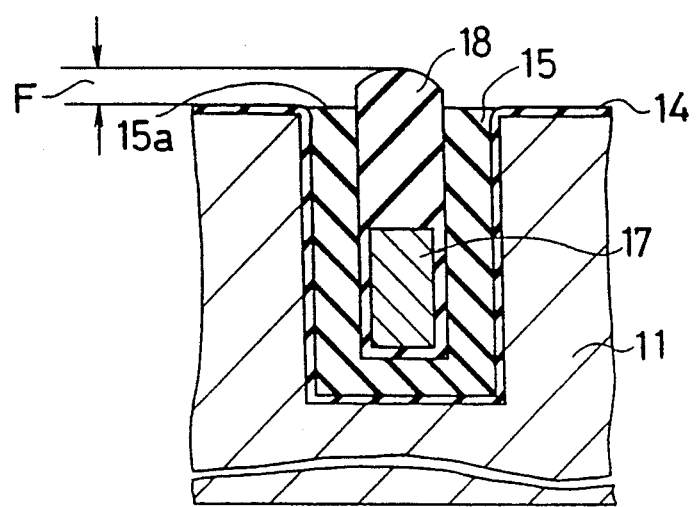
Figure 5:
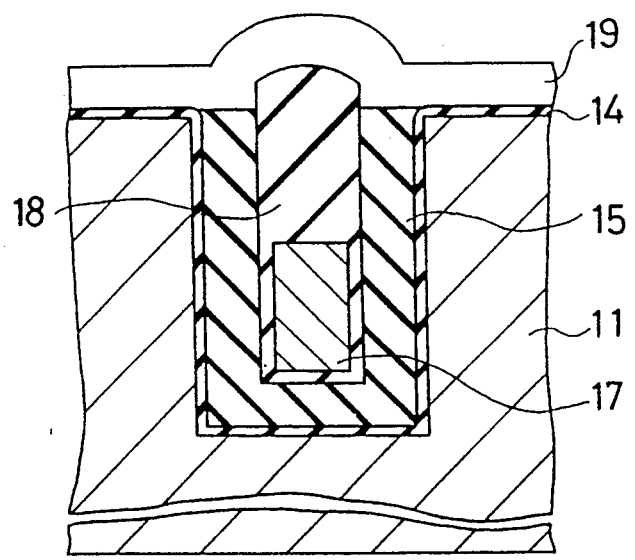
Figure 5:
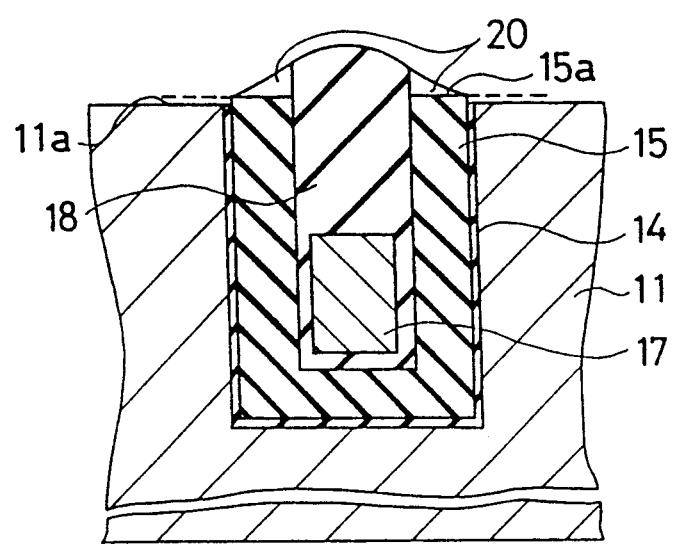

FIG. 5 is a view showing sequential manufacturing steps for forming an element isolating portion based upon the principle of the second embodiment of the manufacturing method according to the present invention. A method of manufacturing a C-MOS transistor in accordance with the principle will be described later as a second embodiment with reference to FIG. 6.

In FIG. 5, a $SiO_2$ film 12 is formed on the Si substrate 11, and then the $SiO_2$ film 12 is etched by known photolithography. After a resist is removed, the Si substrate 11 is etched using the $SiO_2$ film 12 as a mask to form a trench 13 (see FIG. 5(a)). After the trench 13 is formed, the $SiO_2$ as a mask is removed. In this case, the trench 13 is less than 1.2 $\mu$m in width and is about 4 to 6 $\mu$m in depth.

A $SiO_2$ film 14 is formed by thermal oxidation or CVD, and then a $Si_3N_4$ film 15 is formed by CVD. Further, a $SiO_2$ film 16 is formed on the $Si_3N_4$ film 15 by CVD. The $SiO_2$ film 16 is to inhibit excess etching when a poly-Si film is etched back later. Lastly, the trench 13 is filled with a poly-Si film 17 by LPCVD (see FIG. 5(b)). The $SiO_2$ film 14 has a thickness of about 200–300 Å, the $Si_3N_4$ film 15 has a thickness of 100–3000 Å, and the $SiO_2$ film 16 has a thickness of about 100 Å which is necessary in etching back the poly-Si film. Thickness d of the poly-Si film 17 is almost the same as the width of the trench after the $SiO_2$ film 16 is formed.

The poly-Si film 17 is anisotropically etched back by RIE to leave the poly-Si film 17 in the trench (see FIG. 5(c)). After that, the $SiO_2$ film 16 outside the trench is removed with HF (see FIG. 5(d)).

An exposed surface 17a of the poly-Si film 17 remaining in the trench is oxidized with heat to form a $SiO_2$ film 18 on the exposed surface 17a. The level of surface 18a of the oxidized $SiO_2$ film 18 depends on the amount of the poly-Si film 17 which is overetched in etching back, and the thickness of the $SiO_2$ film 16 (see FIG. 5(e)).

After the oxide film is removed from the $Si_3N_4$ film 15, the $Si_3N_4$ film 15 outside the trench 13 is removed by a wet etching with liquid phosphorus acid or a dry etching (see FIG. 5(f)).

Then, a $SiO_2$ film 19 is deposited by CVD, and thereafter the $SiO_2$ film 19 is removed by a combination of a dry etching, and a wet etching in that order, to form a side wall 20 of $SiO_2$ Lastly, the $SiO_2$ film 14 is removed with HF. Thus, an element isolation is finished (see FIG. 5(g)). At this time, a difference in level of about 280 Å is made between the surface 11a of the Si substrate outside the trench and the surface 15a of the field area. However, such a small level difference has no effect on the element if used as the isolated element.

A method of manufacturing a C-MOS transistor in accordance with the principle explained in conjunction with FIG. 5 will now be described with reference to FIG. 6.

Figure 6:
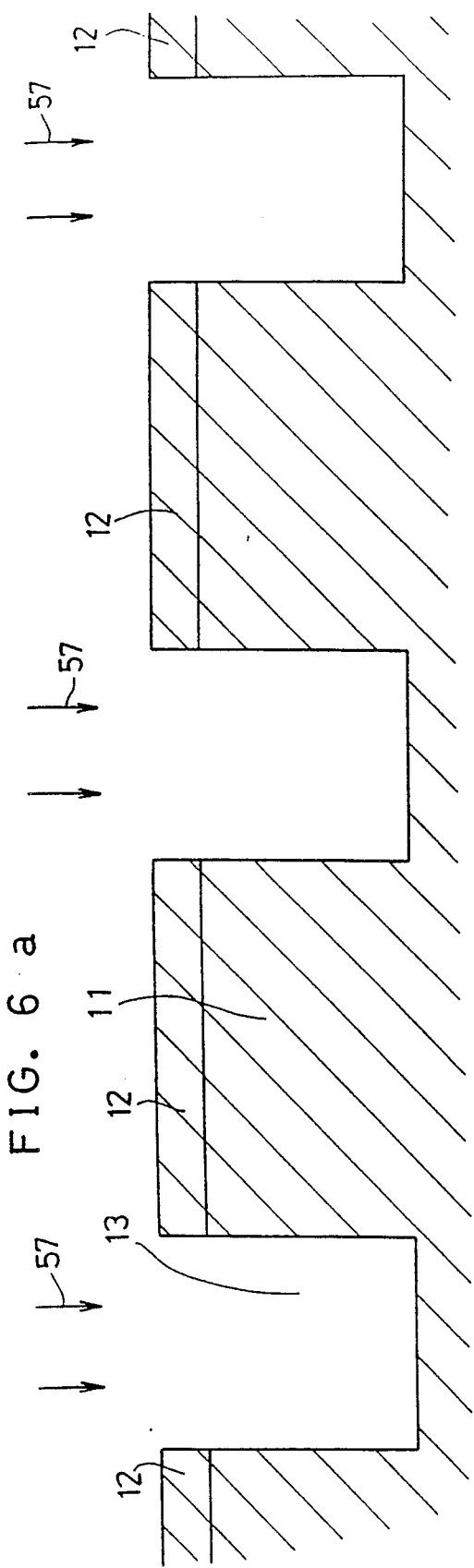
FIG. 6 is a view presented for explaining the process steps of the second embodiment according to the present invention.
Figure 6:
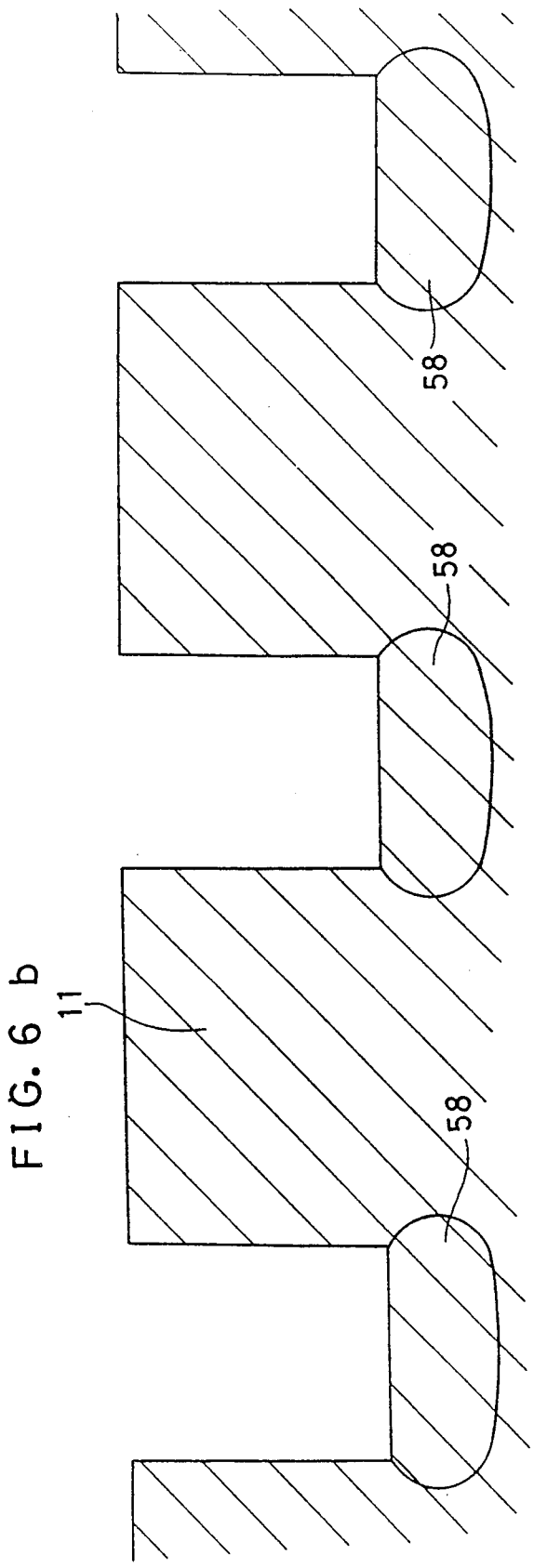
Figure 6:
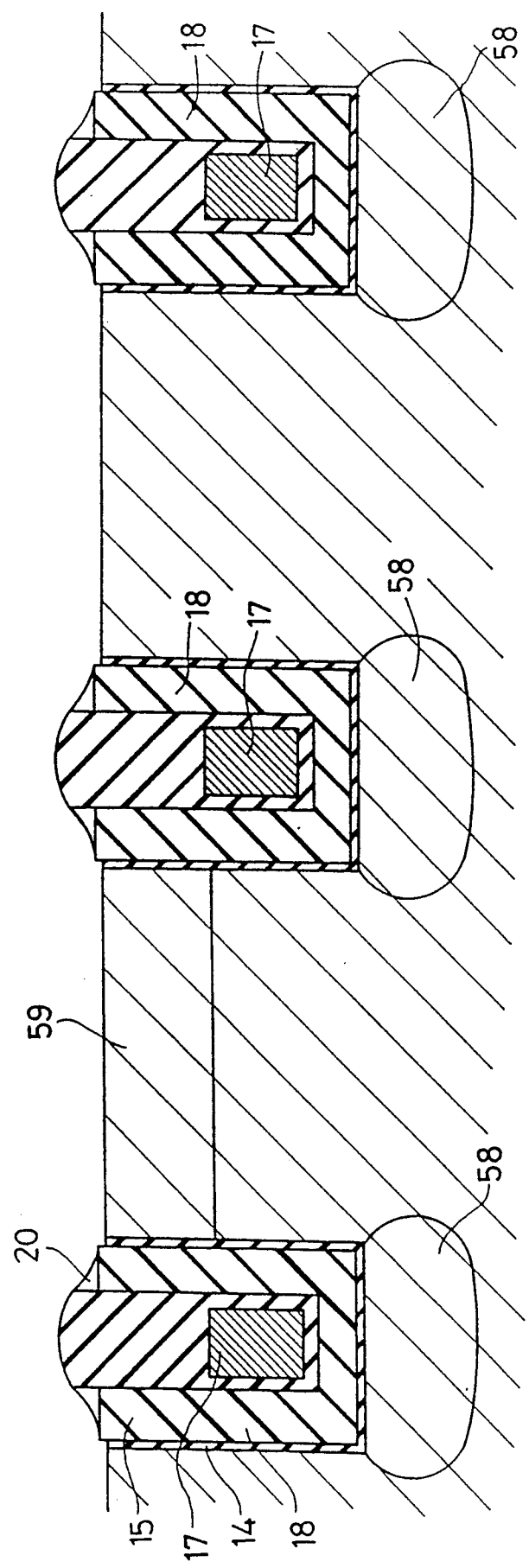
Figure 6:
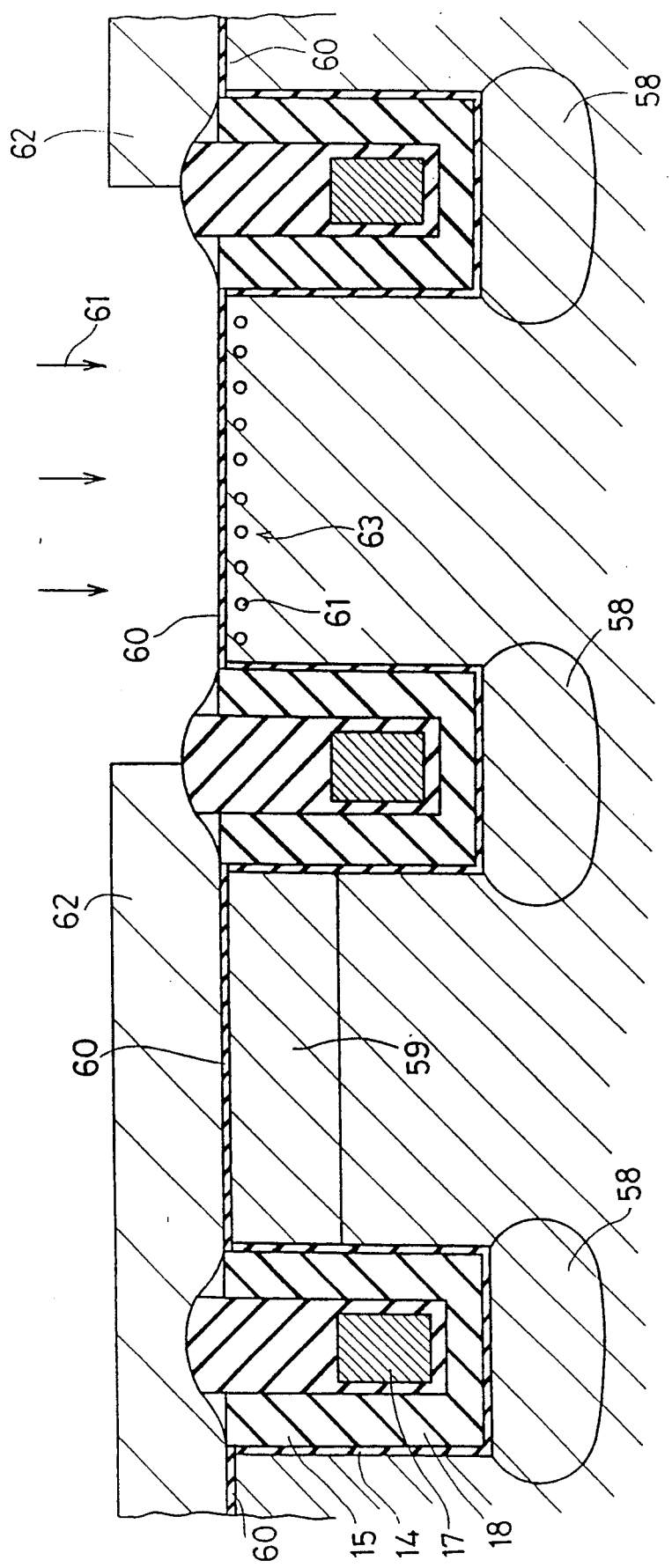

In FIG. 6, boron (B) 57 is implanted to the Si semiconductor substrate 11 through trench 13 using the $SiO_2$ film 12 as a mask (see FIG. 6(a)).

Then, a channel stopper 58 is formed on the Si semiconductor substrate 11 by ion implantation, and the $SiO_2$ film 12 is removed (see FIG. 6(b)).

Further, an n- well layer 59 is formed, and thereafter an element isolating portion is formed by the steps of FIG. 5(b) to FIG. 5(h) (see FIG. 6(c)).

After a gate oxide film 60 is formed, boron (B) 61 is implanted to form an n-channel region 63 (see FIG. 6(d)). At this time, the boron is implanted by the well-known photolithography technique, using a resist film 62 as a mask. The value of the threshold voltage Vth in the n-channel of the transistor is controlled by the implantation of boron.

Figure 6E:
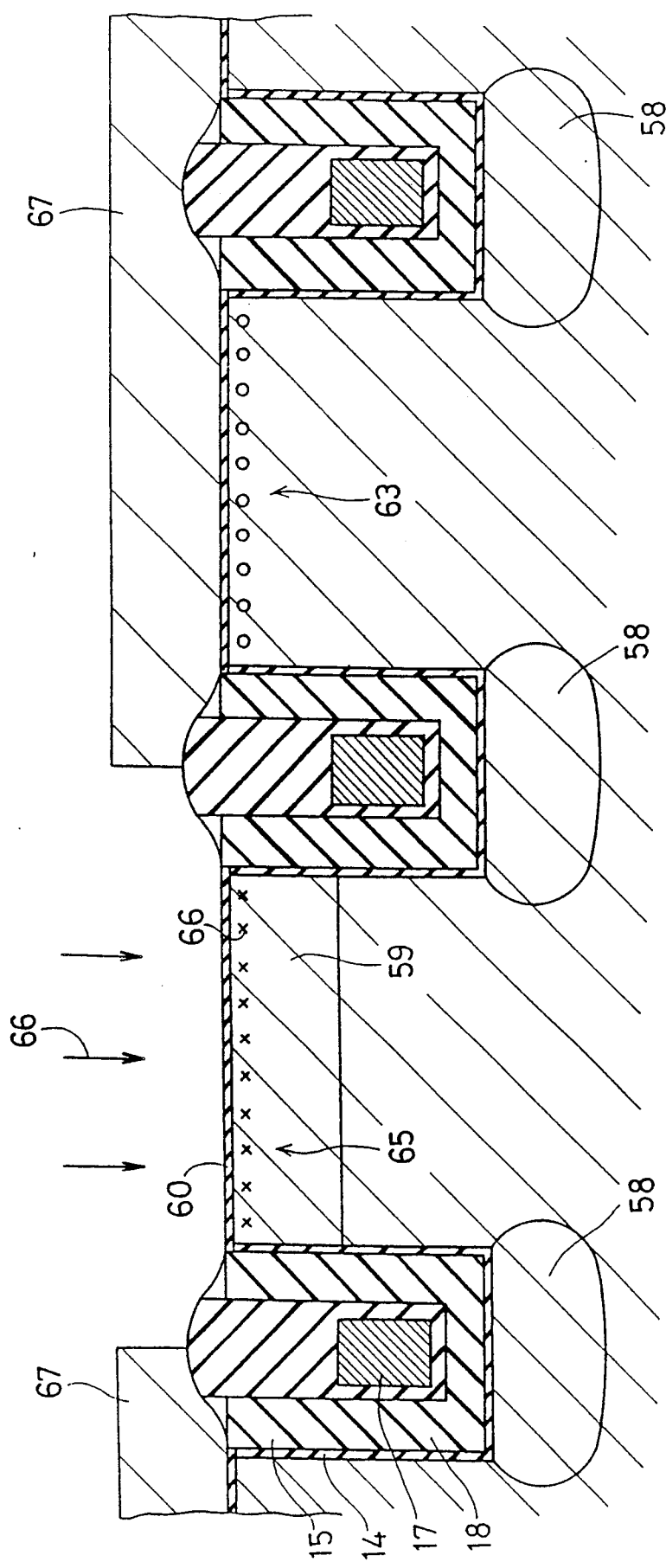

Then, a p-channel region 65 is formed in the n-well layer 59 (see FIG. 6(e)), and boron 66 is implanted so that the threshold voltage Vth in the p-channel of the transistor is controlled. A resist film 67 used then is removed.

Figure 6F:
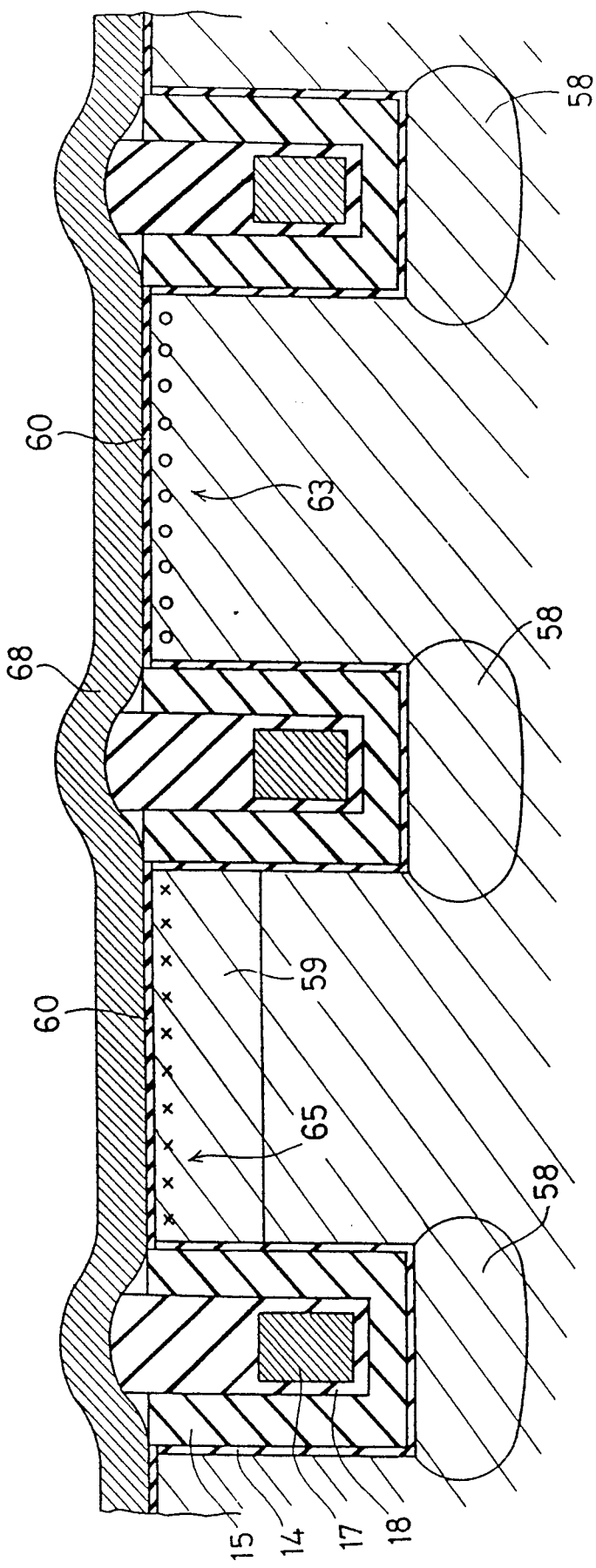
Figure 6:
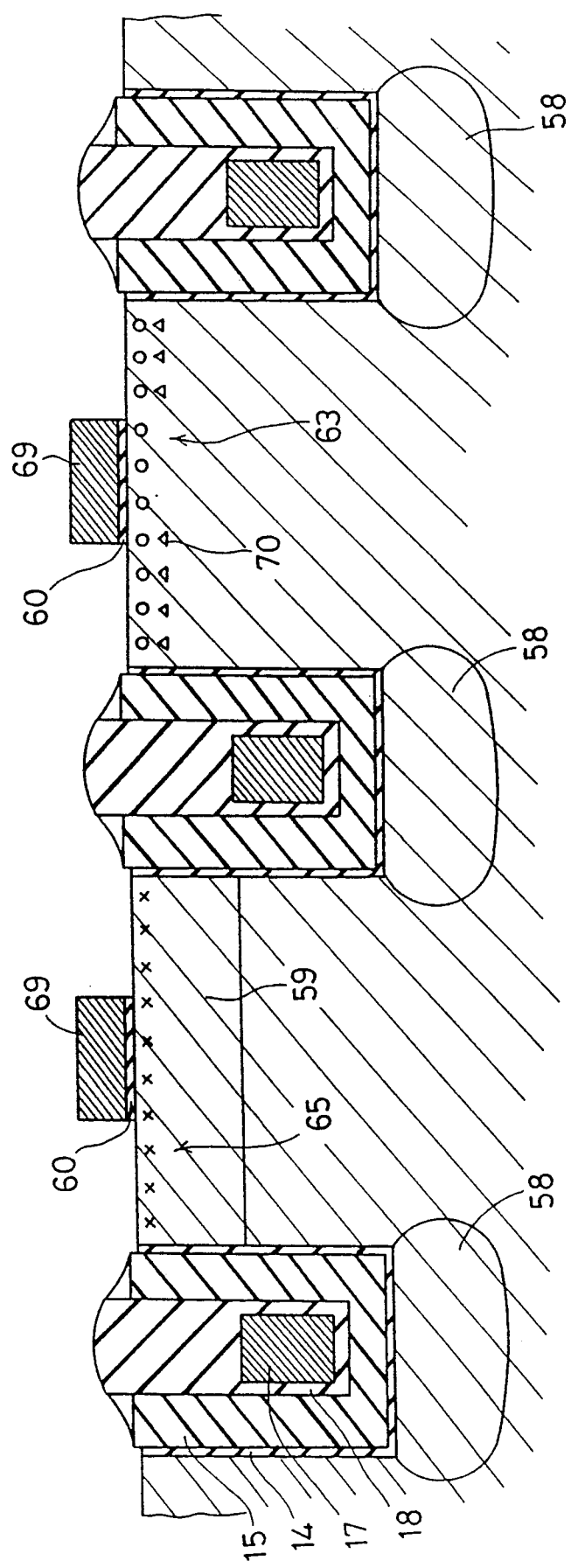
Figure 6:
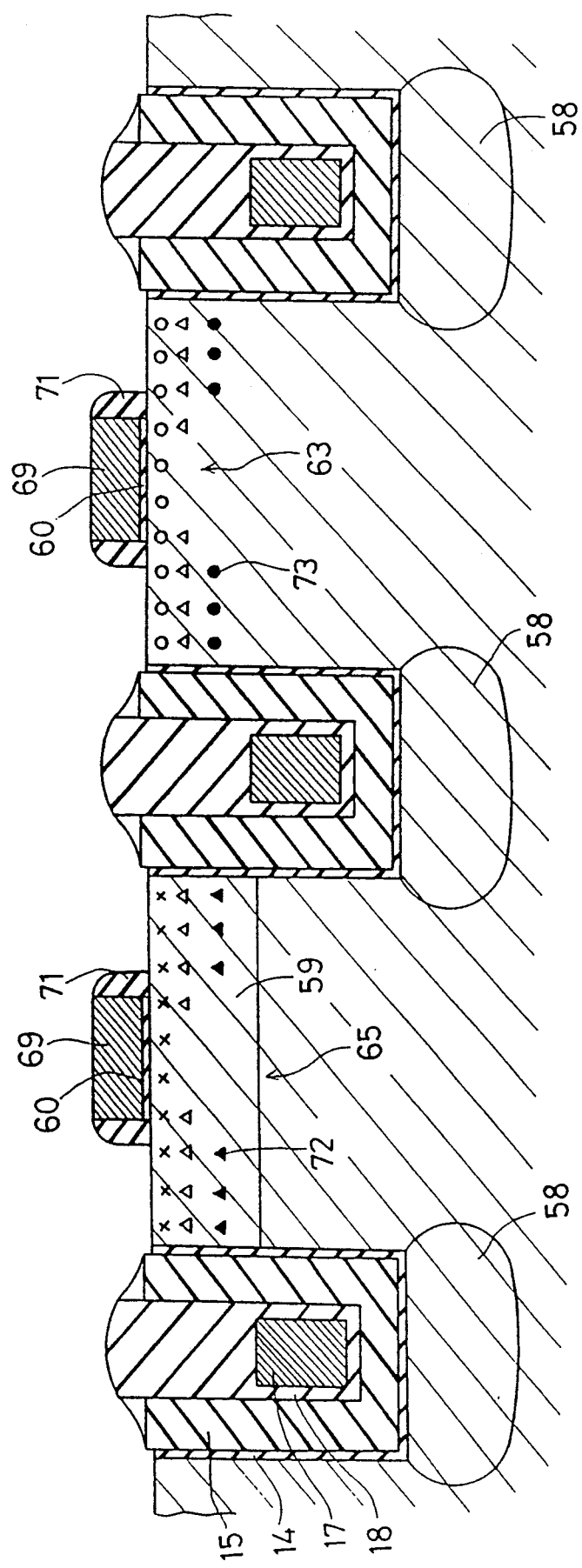
Figure 6:
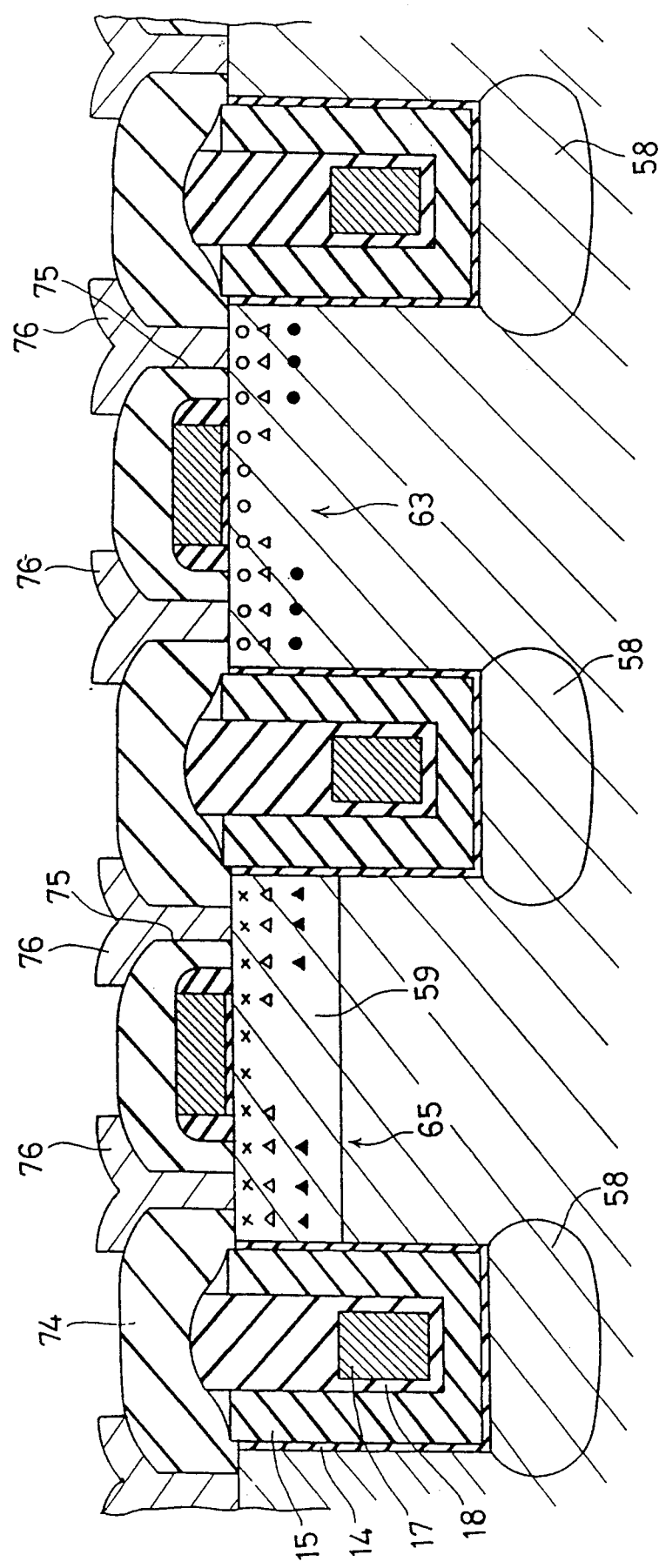
Figure 9:
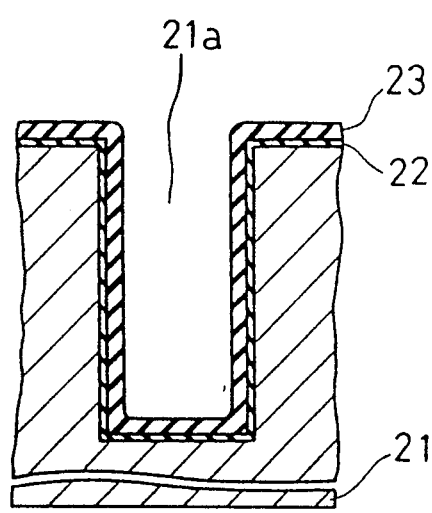
FIG. 9 is a view presented for explaining manufacturing steps in another prior art embodiment; and, FIG. 10 is a view presented for explaining manufacturing steps in a prior art embodiment.
Figure 9:
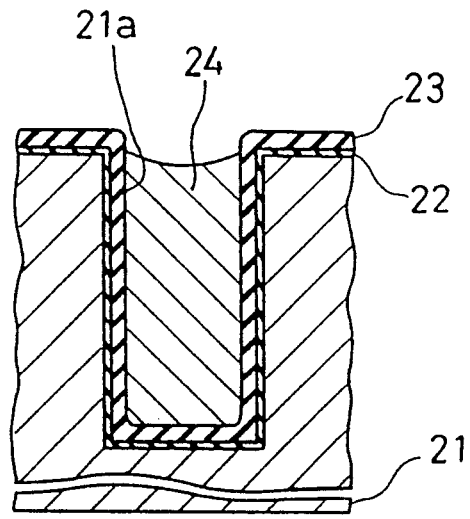
Figure 9:
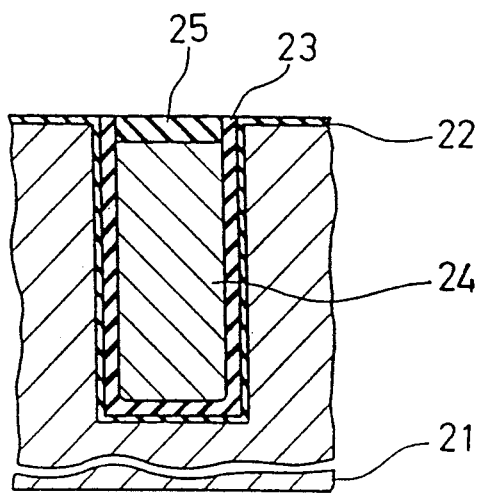
Figure 10A:
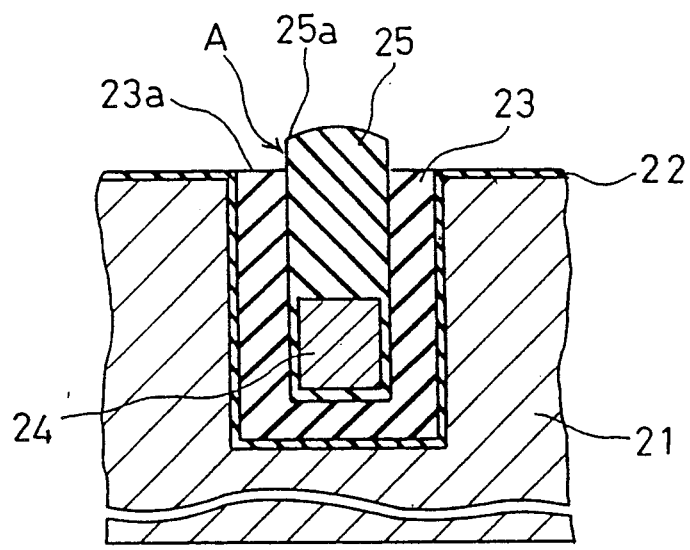
Figure 10B:
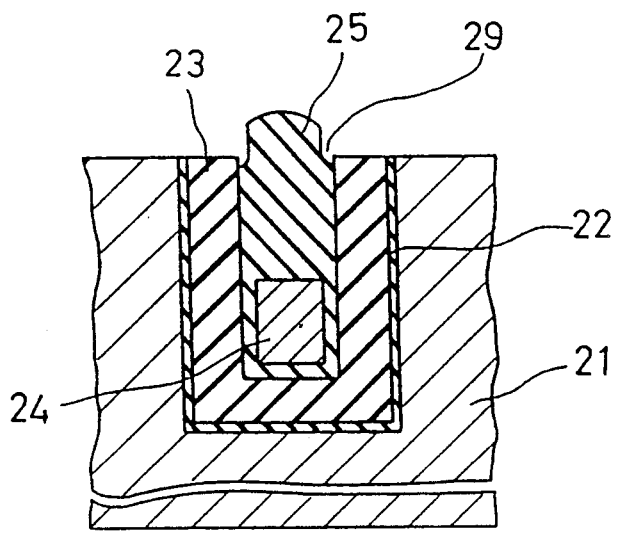

After that, a poly-Si layer 68 is formed over the gate oxide film 60 (see FIG. 6(f)).

Further, a gate electrode 69 is formed, and LDD 70 is implanted only to the n-channel region 63 (see FIG. 6(g)). The formation of the gate electrode 69 is performed by the well-known photolithography technique, and gate oxide film 60 is removed.

A side wall 71 of the gate electrode 69 is formed by the well-known deposition removing step (see FIG. 6(h)).

Further, n+ and p+ impurities 72, 73 are implanted to each of the channel regions 65, 63 (see FIG. 6(i)). The impurity implantation is performed by the well-known photoresist formation step.

Lastly, an insulating layer 74 is formed by sequentially forming a non-doped SG film and a BPSG film. A contact hole 75 is formed in the insulating layer 74, and then a wiring portion 76 of Al is formed. Thus, the C-MOS transistor is made (see FIG. 6(j)).

The first and second embodiments are presented for explaining examples of forming an element isolating portion. If the poly-Si films 4, 17 are connected to a capacitor plate, information storing capacitors having the insulators of the $SiO_2$ films 2, 14 and of the $Si_3N_4$ films 3, 15, respectively, can be made.

As has been described in detail, according to the present invention, a deep trench is securely filled up and an element isolation or an information storing capacitor suitable for high integration is provided.

What is claimed is:

1. A method for manufacturing a semiconductor device comprising the steps of:
   (i) making a trench in a Si semiconductor substrate;
   (ii) forming on the surface, including said trench, of said Si semiconductor substrate a thermal oxidation film, a $Si_3N_4$ film and a $SiO_2$ film by a chemical vapor deposition as a three-layered insulating film in that order;
   (iii) forming a polysilicon layer, with the polysilicon filling said trench having said three-layered insulating film;
   (iv) removing said polysilicon layer outside said trench;
   (v) removing said $SiO_2$ film of said three-layered insulating film located above the exposed surface of said polysilicon layer in said trench;
   (vi) converting the exposed surface of said polysilicon layer in said trench to a $SiO_2$ film by a thermal oxidation;
   (vii) removing said $Si_3N_4$ film of said three-layered insulating film located above the opening of said trench;
   (viii) depositing a $SiO_2$ film by a chemical vapor deposition on the entire surface of said Si semiconductor substrate including said trench; and
   (ix) forming a side wall by leaving a $SiO_2$ film only at the peripheral portion of said $SiO_2$ formed by said thermal oxidation;
   whereby an element isolating portion is formed in said trench.

2. The method according to claim 1, wherein said thermal oxidation film in said three-layered insulating film is formed by a wet oxidation method.

3. The method according to claim 1, wherein said thermal oxidation film in said three-layered insulating film is formed by a dry oxidation method.

4. The method according to claim 1, wherein said $Si_3N_4$ film in said three-layered insulating film is formed by a chemical vapor deposition.

5. The method according to claim 1, wherein said $SiO_2$ film on said $Si_3N_4$ film in said three-layered insulating film is deposited by a chemical vapor deposition at 700 to 900° C. with a mixed gas of $SiH_4$ and $N_2O$.

6. The method according to claim 1, wherein said $SiO_2$ film on said $Si_3N_4$ film in said three-layered insulating film is deposited by a chemical vapor deposition at 350 to 450° C. with a mixed gas of tetra ethoxy-silane and ozone.

7. The method according to claim 1, wherein said polysilicon layer is buried in said trench by a low vapor pressure chemical vapor deposition.

8. The method according to claim 1, wherein said polysilicon layer outside said trench is removed by isotropic etching.

9. The method according to claim 1, wherein said polysilicon layer in said trench has its exposed surface oxidized with heat by a wet thermal oxidation at 950 to 1100° C.

10. The method according to claim 1, wherein said $SiO_2$ film formed by oxidizing with heat the exposed surface of said polysilicon layer in said trench has at its peripheral portion a side wall formed of said deposited $SiO_2$ film by a chemical vapor deposition at 700 to 900° C. with a mixed gas of $SiH_4$ and $N_2O$.

11. The method according to claim 1, wherein said $SiO_2$ film formed by oxidizing with that the exposed surface of said polysilicon layer in said trench has at its peripheral portion a side wall formed of said deposited $SiO_2$ film by a chemical vapor deposition at 350 to 450° C. with a mixed gas of tetra ethoxy-silane and ozone.

* * * * *